United States Patent [19]

Enomoto et al.

[11] Patent Number: 5,166,130
[45] Date of Patent: Nov. 24, 1992

[54] SUPERCONDUCTIVE CERAMIC MOLDED PRODUCT AND A PRODUCTION PROCESS THEREOF

[75] Inventors: Ryo Enomoto; Yoshimi Matsuno, both of Ogaki, Japan

[73] Assignee: Ibiden Co. Ltd., Gifu, Japan

[21] Appl. No.: 213,834

[22] Filed: Jun. 30, 1988

[30] Foreign Application Priority Data

Jul. 3, 1987 [JP] Japan .................. 62-165225
Aug. 4, 1987 [JP] Japan .................. 62-193841
Aug. 4, 1987 [JP] Japan .................. 62-193842

[51] Int. Cl.$^5$ ............................................ C01G 1/00
[52] U.S. Cl. ........................................ 505/1; 505/701; 505/704; 505/734; 505/739; 505/740; 505/780; 264/211.11; 264/211; 264/177.1; 264/DIG. 19; 252/521; 428/702; 428/413; 428/412; 428/688
[58] Field of Search ................. 505/1, 701, 704, 734, 505/735, 739, 740, 741, 780; 264/211.11, 211, 177.1, DIG. 19; 252/521; 428/702, 688, 413, 412

[56] References Cited

U.S. PATENT DOCUMENTS 4,797,378 1/1989 Sowman .................. 264/DIG. 19
4,952,390 8/1990 Takei et al. .................. 423/593
4,952,559 8/1990 Jin et al. .................. 505/704

OTHER PUBLICATIONS

Yang et al., "Effects of Fluctuation in Cu Stoichiometry on the Superconductivity of Microstructure of YBA$_2$-Cu$_x$Y", MRS Extended Abstracts High Temperature Superconductor II, Apr. 5-9, 1988, pp. 331-334.

Hasuo et al., "Plasma Polynegation for High T$_e$ oxide Superconductors", Appl. Phys. Lett., 52(22) 30 May 1988.

Jin et al., "Fabrication of 91K Superconducting Coils", MRS Preprints given at MRS Meeting, Anaheim Calif. Apr. 21-24 1987.

M. H. Alford et al., "Physical and Mechanical Properties of YBA$_2$Cu$_3$O$_{7-g}$ Superconductors", Journal of Materials Science 23 Feb. 1988 761-68.

Damento et al., "Preparation of Single Crystals of Superconducting YBa$_2$Cu$_3$O$_{7-x}$ from Cu Melts", Preprints on High T$_c$ Superconductors, Div. Mat'l Science, OBES, USDOE vol. 1, #6, 15 Jul. 1987.

Ohtoi et al., "Preparation and High T$_c$ Superconductivity of Ba-Y-C-Oxide", Jap J Appl Phys vol 26 #5 May 1987 pp. L818-L819.

Primary Examiner—William R. Dixon, Jr.
Assistant Examiner—C. Melissa Bonner

[57] ABSTRACT

A superconductive ceramic wire or film comprises 100 parts by weight of superconductive oxide crystal composed of a rare earth element, an alkaline earth metal, copper, and oxygen, and 0.2-5.0 parts by weight of copper oxide, thereof.

13 Claims, 1 Drawing Sheet

SUPERCONDUCTIVE CERAMIC MOLDED PRODUCT AND A PRODUCTION PROCESS THEREOF

FIELD OF THE INVENTION

This invention relates to a superconductive ceramic sintered product and a production process thereof. More particularly, it relates to a sintered product made of a dense, strongly sintered superconductive ceramic sintered product having a high critical temperature and a high critical current density, and a production process thereof.

DESCRIPTION OF THE PRIOR ART

Recently, oxides showing superconductivity even at the liquid nitrogen temperature have been found, and this gives relevant industries a great impact. However, before putting a superconductive ceramic to practical use, it is required to be given a shape by molding or any other means; that is, the very important technological subject to breakthrough at present is how to mold a product and sinter such an extremely hard and fragile material.

In this connection, a production process of a superconductive ceramic wire is disclosed at page 526 of Volume 22 (1987), No. 6 of the Journal of Ceramics. According to the report, a powdered ceramic is packed in a silver pipe, which is drawn, coiled, and heated in an oxygen atmosphere in order to shape it into a wire. Also, according to the publication of Argonne National Research Institute, to begin with a powdered Y-Ba-Cu-O mixture is mixed with a polymer in order to give it a wiry shape, which is burnt so that a superconductive flexible wire can result therefrom.

In the first process, however, the powdered ceramic can hardly be sintered so dense that there will not form in sintered powder particle so many contact points as giving it a good superconductivity. Moreover, the metal tends to diffuse into the ceramic from the pipe, and the oxygen content in the heating atmosphere, which actually has a great influence or the superconductivity of the ceramic, is impossible to control accurately, because the powdered ceramic is heated, packed in a pipe. Also, in the second process are problems, such as a wire product has difficulty in retaining its shape to the end of the sintering process; mechanical properties of a wire product deteriorate by the growth of ceramic particle; and such decomposition that greatly lowers superconductivity follows in the ceramic when a dense sintered ceramic sintered product is desired to be produced. Like this, the fact is that so far there have been found neither dense sintered superconductive ceramic sintered products having a high critical temperature and a high critical current density nor a production processes to realize them.

SUMMARY OF THE INVENTION

Under the circumstances, the present inventor made intensive studies to eliminate drawbacks in a conventional process, and finally accomplished this inventors by finding a superconductive ceramic sintered product, them and strongly sintered and provided with a high critical temperature and a high critical current density. That is, it is an object of this invention to provide a good superconductive ceramic mold as just mentioned, and a production process to realize it. And, this object can be fulfilled by a superconductive ceramic sintered product, characterized by comprising 100 parts by weight of superconductive oxide fine crystal composed of a rare earth element, an alkaline earth metal, copper, and oxygen, and 0.2-5.0 parts by weight of copper oxide, wherein the mean particle size of said superconductive oxide fine crystal is not greater than 5 $\mu$m, and a production process of superconductive ceramic sintered product, characterized by comprising: mixing an oxide fine powder composed of a rare earth element, an alkaline earth metal, copper, and oxygen with an organic copper compound solution in such a way as to make up a viscous solution mixture, and, after shaping said solution mixture into a sintered product by extruding it from an orifice or coating it on a plate, sintering said sintered product in an oxygen-containing atmosphere. In this respect, the superconductive ceramic sintered product is especially desirable to have a wiry or a filmy form, and when having a wiry form, the surface of the sintered product is desirable to be coated.

BRIEF DESCRIPTION OF THE DRAWING FIGURE

FIGURE 1 is an illustration showing the dependency of the electric resistance of superconductive ceramic wire in Example 1 on the temperature.

DETAILED DESCRIPTION OF THE PREFERRED EMBODIMENT

Figure 1:
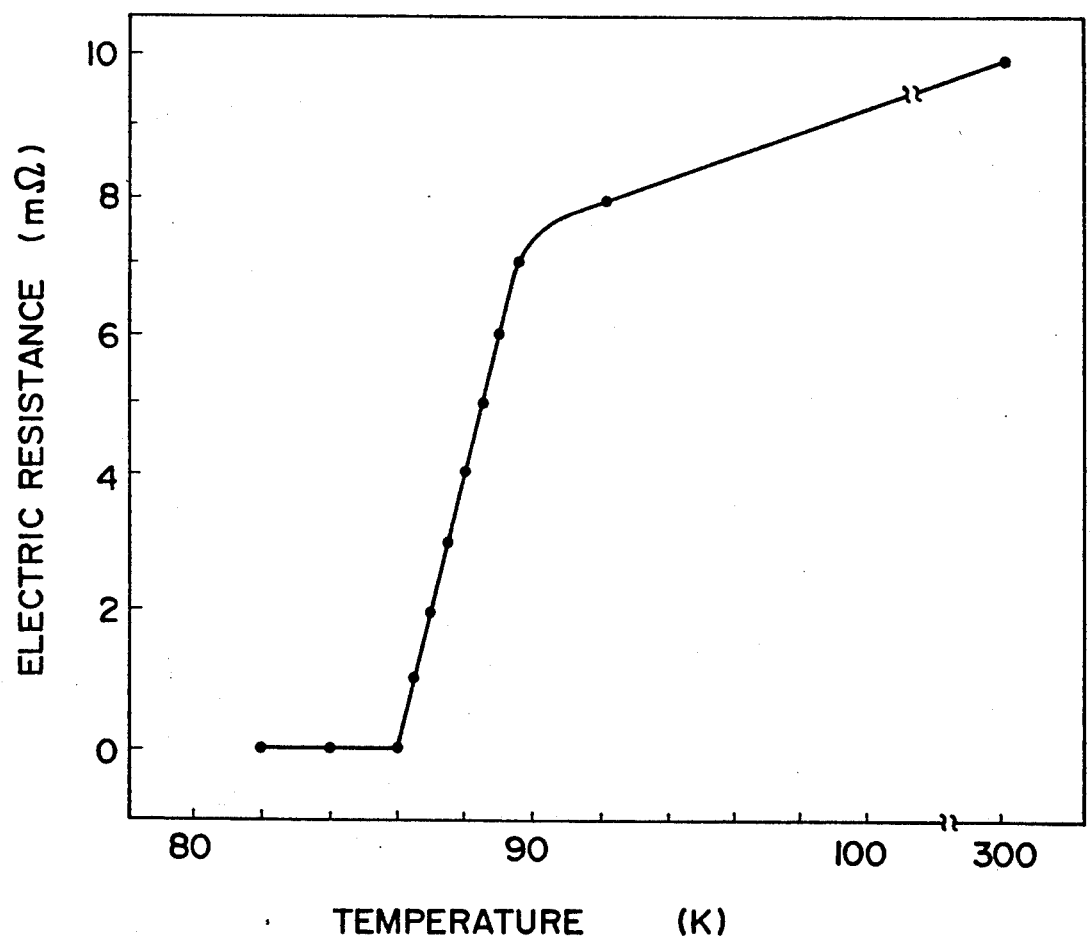

In order that this invention may be understood more clearly, reference will now be made to the preferred embodiment. As stated above, the superconductive oxide fine crystal is composed of a rare earth element, an alkaline earth metal, copper, and oxygen; the rare earth element can be at least one element selected from the group consisting of Y, Nd, Sm, Eu, Gd, Ho, Er, Tm, Yb, Lu, and La; also, the alkaline earth metal can be at least one element selected from the group consisting of Ba, Ca, and Sr. The chemical composition of the superconductive oxide fine crystal can be shown concretely by $YBa_2Cu_3O_{6.5+x}$, $TmBa_2Cu_3O_{6.5+x}$, $(La_{1-x}Ba_x)_2CuO_{4-y}$, or $(La_{1-x}Sr_x)_2CuO_{4-y}$, for example. A superconductive oxide fine crystal represented by $RA_2Cu_3O_{6.5+x}$, where R stands for a rare earth element, and A stands for an alkaline earth metal, shows so high a superconducting critical temperature as 90° K. that it is especially suitable for this invention.

The superconductive ceramic sintered product of this invention has to comprise 100 parts by weight of the above-mentioned superconductive oxide fine crystal, and 0.2-5.0 parts by weight of copper oxide, where the content of the copper oxide is calculated in terms of copper (II) oxide (CuO). The reason that more than the theoretical amount of copper oxide must be added to the oxide fine crystal away from the above-exemplified chemical compositions comes from the fact that, unless otherwise, the superconductive oxide fine crystal causes decomposition like

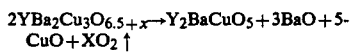

$$2YBa_2Cu_3O_{6.5+x} \rightarrow Y_2BaCuO_5 + 3BaO + 5CuO + XO_2 \uparrow$$

at such elevated temperatures about 950° C. as it is well sintered, and produces an insulating substance, with the result that superconductive properties, in terms of the critical temperature and the critical current density, decline greatly. Contrary to this, when an excess amount of CuO is present in the superconductive oxide fine crystal, not only can the above-mentioned decomposition reaction be controlled but also CuO forms a liquid phase and effectively helps sinter the superconductive oxide fine crystal as an auxiliary agent in order that the oxide crystal may give a dense, strongly sintered superconductive ceramic in which the oxide crystal particles come into close contact with one another whereby the high critical temperature and the high critical current density can be imparted to the superconductive ceramic.

When the copper oxide content in the superconductive oxide fine crystal is less than 0.2 part by weight, based on 100 parts by weight of the same superconductive oxide fine crystal, the copper oxide's desirable effect of preventing the above-mentioned decomposition reaction and serving as an auxiliary agent declines, which makes the mechanical properties and the superconductivity of the superconductive ceramic inferior. On the other hand, when the copper oxide content in the superconductive oxide fine crystal is greater than 5.0 parts by weight, based on 100 parts by weight of the same superconductive oxide fine crystal, there increasingly appear non-superconductive regions in the oxide crystal, which similarly lowers the superconductivity thereof. For these reasons, the copper oxide content in the superconductive oxide fine crystal is required to be in the range 0.2–5.0 parts by weight, on the basis of 100 parts by weight of the same superconductive oxide fine crystal, and when it is in the range 0.3–3.0 parts by weight, the superconductivity of the ceramic is especially so good that this range is preferable for this invention.

Meanwhile, the superconductive oxide fine crystal has to be not greater than 5 $\mu$m in terms of the mean particle, and when it is 2 $\mu$m or less in terms of the mean particle size, it is very desirable for this invention. It is because, when the mean particle size of the superconductive oxide fine crystal is greater than 5 $\mu$m, the superconductive ceramic becomes so fragile that the mechanical properties thereof widely deteriorate.

The porosity of the superconductive ceramic is desirable to be not greater than 10 percent, and desirable to be not greater than 4 percent in particular. It is because, when it is greater than 10 percent, the contact face between every two oxide crystals becomes so smaller than required that the critical current density unfavorably declines.

Since wire and film products made of the superconductive ceramic of this invention are densely sintered by the effect of copper oxide as an auxiliary agent and the decomposition of the superconductive oxide fine crystal is kept to a minimum, they are provided with the high critical temperature and the high critical current density.

Preferably, when the diameter of the wiry products is 7–600 $\mu$m, or more preferably when it is 7–20 $\mu$m, they increase flexibility and their mechanical properties are improved, accordingly.

The superconductive ceramic sintered products of this invention are desirably coated with one or two kinds of either metal or plastic. It is because, when uncoated, the superconductive ceramic is likely to lose its superconductivity by the action of moisture, after a long exposure to air, whereas, when coated with metal or plastic, the coating can prevent the ceramic's decomposition resulting from the exposure to air, and help it keep its stable superconductivity, over a long period of time.

Incidentally, the superconductive ceramic sintered products can be coated with a single layer of metal or plastic. They can also be coated with alternative layers of metal and plastic; moreover, they can be coated with metal and plastic, by the combination of the above two systems.

As stated above, the superconductive ceramic sintered products of this invention are not only densely sintered by the use of copper oxide as an auxiliary agent but also their contact with air is intercepted with metal and/or plastic, so that they can keep the high critical temperature and the high critical current density, extending a long period of time.

Reference will now be made in detail to a production process of the superconductive ceramic wires and films of this invention. The oxide fine powder composed of a rare earth element, an alkaline earth metal, copper, and oxygen, which is used as an indispensable material in the production process of this invention, can be prepared by various processes, such as (1) mixing oxide or carbonate powders of a rare earth element, an alkaline earth metal, and copper respectively by a prescribed amount, and calcining the powder mixture; (2) mixing nitrate or chloride aqueous solutions of a rare earth element, an alkaline metal, and copper respectively by a prescribed amount, and calcining precipitate appearing by the addition of oxalic acid to the solution mixture after filtration; or (3) mixing alkoxide solutions of a rare earth element, an alkaline earth metal, and copper respectively by a prescribed amount, adding water thereto so as to polycondense them by hydrolysis, and calcining the gelatinous substance appearing therefrom. Among these processes, the coprecipitation process (2), and the sol-gel process (3) can yield such uniform superconductive fine powder that they are advantegeous for this invention. The above-mentioned prescribed amount of the each element is desirable to be in proximity to a theoretical composition from which the oxide fine powder can be produced as desired. Also, the CuO content can be adjusted afterward.

The oxide fine powder is desirable to have been calcined at 550° C. and above prior to mixing with the organic copper compound solution. It is because, when the calcination temperature is lower than 550° C., each of the elements is difficult to diffuse into one another, and make up the oxide fine powder uniform in composition. The oxide thus calcined is finely powdered by means of a jet mill or a ball mill, for example. The powdered oxide can also be classified into groups of various desired particle size by using an air classifier. The mean particle size of the oxide fine powder is desirable to be not greater than 1 $\mu$m; it is especially desirable to be not greater than 0.3 $\mu$m. It is because, when the mean particle size of the oxide fine powder is greater than 1 $\mu$m, the oxide fine powder is difficult form into a length of thin wire uniform in diameter, and the crystal size in a sintered wire grows so large and coarse that the mechanical properties of the wire become poor.

According to this invention, the oxide fine powder needs to be mixed with an organic copper compound solution. It is because the oxide fine powder particle can be mixed very uniformly with the solution, which serves as a mixing auxiliary agent, as well as a binder for shaping the oxide powder into wire and sintering it, with its wire shape kept unchanged. It is additionally because CuO, produced from the organic copper compound upon sintering in an oxygen-containing atmosphere, serves as a sintering auxiliary agent and acts on the calcined oxide fine powder so as not to produce an insulating substance in progress of sintering. For these reasons, used as the organic copper compound is at least one compound selected from the group consisting of copper naphthenate, copper oleate, copper gluconate, copper acetate, copper formate, various copper alkoxides and various hydrolyzed products resulting from the hydrolysis of various copper alkoxides. Among other things, copper naphthenate, which has a larger molecular weight than the others, copper oleate, and copper alkoxides, which hydrolyze, polycondense, and make a polymer by themselves, facilitate the molding of a wire or film; thus, they are suitable for this invention. Among solvents used to dissolve the organic copper compound are various alcohols, toluene, benzene, and hexane, for example. In addition to the above, an appropriate amount of organic polymer, such as ethylene glycol, glycerin, and polypropylene oxide can be mixed in a viscous solution prepared from the oxide fine powder, and the organic copper compound by the addition of the solvent in order that the solution may easily be shaped into a length of wire or thin film by adjusting the viscosity or thixotropic properties of the solution.

As stated above, according to this invention, the oxide fine crystal and the organic copper compound solution are mixed in order to make up a viscous solution in advance, which is molded into a wire or film, for example. Moreover, according to this invention, the oxide fine crystal and the organic copper compound solution are mixed uniformly, and dried, from which a viscous solution is prepared so as to use for molding. The part ratio of the organic copper compound calculated in terms of CuO to the oxide fine powder is 0.2-5.0 : 100, on the basis of their weight. When it is 0.3-3.0 : 100, the most desirable result can be obtained. It is because, when the organic copper compound is less than 0.2 part by weight, on the basis of 100 parts by weight of the oxide fine powder, a dense, strongly sintered molded product cannot be produced; therefore, the mechanical strength and the superconductivity of a produced wire or film declines. Contrary to this, when it is greater than 5.0 parts by weight, on the basis of 100 parts by weight of the oxide fine powder, there increasingly appear non-superconductive regions in the produced ceramic sintered product, and they also lower the superconductivity thereof. Meanwhile, a molded wire product can be processed further to various shapes, such as loops, coils, spirals, and so forth, before sintering.

When the solution mixture, comprising the oxide fine powder and the organic copper solution, is molded into a wire, the extrusion spinning process, the drawing spinning process or combined various conventional spinning processes can be applied. When it is molded into film, it is spread on a flat plate by coating and the like so that a film uniform in thickness can be formed. Concretely, in producing film, any process such as (1) printing the solution mixture on a plate through screens, (2) immersing a plate in the solution mixture, and then lifting up the plate at a constant rate, (3) dropping the solution mixture on a rapidly turning table, or (4) coating the solution on a plate with roller (roller coating process) can be employed, for example. In this respect, for example, strontium titanate, zirconia, sapphire, or magnesium oxide can be used for a plate or table.

Subsequently, a sintered product is sintered at a temperature between 750° and 980° C., and preferably between 850° and 980° C. In order to adjust the oxygen content in the superconductive ceramic sintered product, it is required for the sintering atmosphere to contain oxygen. For this reason, pure oxygen, a mixture of oxygen with argon, helium, or nitrogen, or, accordingly, air can be used for the sintering atmosphere. In any case, however, the oxygen content is desirable to be in the range 50-100 percent. The reason for sintering a sintered product at a temperature between 750° and 980° C. comes from the fact that, when the sintering temperature is below 750° C., the oxide fine powder in the sintered product is not sintered so densely that the mechanical strength and the superconductivity of the sintered product become inferior; on the other hand, when the sintering temperature is above 980° C, the growth of sintered crystal becomes so great that the sintered ceramic sintered product becomes brittle.

After sintering, it is desirable that the temperature is lowered slowly at a rate of 60° C. an hour or less with the ceramic sintered product left in the oxygen-containing atmosphere. After having been cooled, the ceramic product can be sintered again in the oxygen-containing atmosphere.

Also, according to this invention, the sintered ceramic sintered product can be put in a metal pipe, such as copper, or coated with metal by the vacuum evaporation process, or the ion plating process, or coated with gas-impermeable plastics, for example. When metal is used for coating, one or more than one kind of elements, such as Au, Ag, Cu, Pt, Al, Fe, Ni, Cr, Pb, Zn, and Sn are desirable to be used. In the case of plastics, one or more than one kind of gas-impermeable plastics, such as ethylene-vinylalcohol copolymer, polyvinylidene chloride, polyacrylonitrile, amorphous nylon, and polyethyleneterephthalate are desirable. In the case that metal and plastic are employed together for multilayered coating, one or more than one kind of plastics including polyethylene, polypropylene, polystyrene, polyester, polycarbonate, phenol resin, epoxy resin, polyphenyleneoxide, polybutyleneterephthalate, and the like can be used. Among processes for coating metal or plastic are the vacuum evaporation process, the ion plating process, the extrusion process, the taping process, and combined processes of these, and any other conventional processes.

This invention will be described more clearly with reference to the examples; however, the examples are intended to illustrate the invention, and not to be construed to limit the scope of this invention.

Example 1

(1) Powdered yttrium oxide of the purity 99.9% (produced by Mitsuwa Kagaku Co., Ltd.), powdered barium carbonate of the purity 99.9% (produced by Raremetallic Co., Ltd.), and powdered copper (II) oxide of the purity 99.9% (produced by Raremetallic Co., Ltd.) are weighed separately by 100, 332, and 201 parts by weight. They are well mixed with one another, molded into a pellet, and heated at 920° C. for 6 hours in air. After that, the pellet is powdered, mixed, and molded into a second pellet.

(2) The second pellet is sintered at 920° C. for 8 hours in air. Then it is powdered, mixed, and molded into a third pellet.

(3) The third pellet is sintered at 930° C. for 24 hours in air, and then powdered by means of a ball mill until its mean particle size comes to be $0.2 \mu$ and below. In this way, an oxide fine powder of this invention is prepared.

(4) Eighty-nine parts by weight of toluene and 0.2 part by weight of water are added to 3.1 parts by weight of copper ethoxyethylate (produced by Hokko Kagaku Kogyo Co., Ltd.), which is used as the organic copper compound of this invention. The copper ethoxyethylate toluene solution is mixed with 100 parts by weight of the oxide fine powder obtained in (3). The solution mixture is condensed until it makes a viscous solution mixture.

Other than that, the solution mixture is dried into powder under reduced pressure by using an evaporator. After the powder is mixed with 1.3 part by weight of triolein, 44.1 part by weight of toluene, and 13.4 parts by weight of isopropyl alcohol, 4.7 parts by weight of polyvinylbutylal and 0.7 part by weight of dibutylphthalate are added thereto, mixed well, and condensed until they make a viscous solution.

(5) The viscous solution mixture is extruded from an orifice so that a length of wire is formed.

(6) The molded wire is sintered at 940° C. for 2 hours in an atmosphere containing 100% oxygen inside a tubular furnace. It is cooled at a rate of 10° C. an hour; as a result, a ceramic wire of this invention, of which the diameter is 150–300 μm, of which the mean crystal size is 2 μm, and of which the porosity is 2.8%, is produced.

The ceramic wire is cut into pieces of a certain length in order to prepare specimen for the determination of its superconductivity. While temperatures are being varied with a cryostat, the variation of their electric resistance and their current density in the zero magnetic field are determined. FIGURE 1 shows the relation between the electric resistance and the temperature, from which the critical temperature is determined. The critical temperature is given in Table 1, together with the critical current density.

Example 2

(1) One hundred parts by weight of an oxide fine powder, which is prepared in the same way as in Example 1, and a copper naphthenate hexane solution, which is prepared by mixing 21.4 parts by weight of hexane with 1.7 part by weight of copper naphthenate (produced by Wako Pure Chemicals Co., Ltd.) as the organic copper compound of this invention, are mixed, and molded into a length of wire in the same way as in Example 1.

(2) After the molded wire is sintered at 940° C. for 1 hour in an atmosphere containing 80% of oxygen and 20% of argon, it is allowed to cool at a rate of 10° C. an hour.

A ceramic wire of this invention, of which the diameter is 150–300 μm, of which the mean crystal size is 1 μm, and of which the porosity is 3.7%, is produced. Its critical temperature and critical current density in the zero magnetic field are determined; they are given in Table 1.

Example 3

(1) One hundred parts by weight of an oxide fine powder, prepared in the same way as in Example 1, and a copper oleate hexane solution, prepared by mixing 35.7 parts by weight of hexane with 48.0 parts by weight of copper oleate (produced by Wako Pure Chemicals Co., Ltd.) as the organic copper compound of this invention, are mixed, and molded into a length of wire in the same way as in Example 1.

(2) After the molded wire is sintered at 940° C. for 2 hours in an atmosphere containing 100% of oxygen, it is allowed to cool at a rate of 15° C. an hour. A ceramic wire of this invention, of which the diameter is 150–300 μm, of which the mean crystal size is 2 μm, and of which the porosity is 2.3%, is produced. Its critical temperature and critical current density in the zero magnetic field are determined; they are given in Table 1.

TABLE 1

|  | Ex. 1 | Ex. 2 | Ex. 3 |
|---|---|---|---|
| Critical temperature (°K.) | 86 | 90 | 86 |
| Critical current density (A/cm$^2$) | 2100 | 1700 | 1800 |

The cross-section of the superconductive ceramic wires prepared according to this invention in Examples 1 to 3 is observed under an electron microscope; as a result, they prove to have been sintered very densely.

Example 4

The ceramic wire prepared in Example 1 is coated with copper by the vacuum evaporation process. The copper-coated ceramic wire is cut into pieces of a certain length in order to prepare specimen for the determination of its superconductivity. The variation of their electric resistance and the current density in the zero magnetic field are determined. As a result of studying the relation between the electric resistance and the temperature, it proves to be similar to that in FIGURE 1. The critical temperature is determined from the result. It is given in Table 2, together with the critical current density.

Example 5

The ceramic wire prepared in Example 2 is coated with copper by the vacuum evaporation process, and then coated with ethylene-vinylalcohol copolymer by the extrusion molding process according to this invention. The critical temperature and the critical current density of the double-coated ceramic wire in the zero magnetic field are determined in the same way as in Example 1. They are given in Table 2.

Example 6

The superconductive ceramic wire prepared in Example 3 is coated with ethylene-vinylalcohol copolymer according to this invention. The critical temperature and the critical current density of the coated ceramic wire in the zero magnetic field are determined in the same way as in Example 1. They are given in Table 2.

TABLE 2

|  | Ex. 4 | Ex. 5 | Ex. 6 |
|---|---|---|---|
| Critical temperature (°K.) | 86 | 90 | 86 |
| Critical current density (A/cm$^2$) | 2100 | 1700 | 1800 |

The cross-section of the superconductive ceramic wires prepared according to this invention in Examples 4 to 6 is observed respectively under an electron microscope; as a result, they prove to be very similar to those in Examples 1 to 3.

Example 7

(1) Powdered yttrium oxide of the purity 99.9% (produced by Mitsuwa Kagaku Co., Ltd.), powdered barium carbonate of the purity 99.9% (produced by Raremetallic Co., Ltd.), and powdered copper (II) oxide of the purity 99.9% (produced by Raremetallic Co., Ltd.)

are weighed separately by 100, 332, and 201 parts by weight. They are well mixed with one another, molded into a pellet, and heated at 920° C. for 6 hours in air. After that, the pellet is powdered, mixed, and molded into a second pellet.

(2) The second pellet is sintered at 920° C. for 8 hours in air. Then, it is powdered, mixed, and molded into a third pellet.

(3) The third pellet is sintered at 930° C. for 24 hours in air, and then powdered by means of a ball mill until its mean particle size comes to be 0.1μ and below. In this way, an oxide fine powder of this invention is prepared.

(4) One hundred and five parts by weight of toluene and 0.2 part by weight of water are added to 2.7 parts by weight of copper ethoxyethylate (produced by Hokko Kagaku Kogyo Co., Ltd.) as the organic copper compound of this invention. The copper ethoxyethylate toluene solution is mixed with 100 parts by weight of the oxide fine powder obtained in (3). In this way, a solution mixture uniform in composition is prepared.

(5) A strontium titanate plate is immersed in the solution mixture produced in (4), and then lifted up at a constant rate so that the plate is coated uniformly with the solution mixture.

(6) The plate thus coated is put in a tubular furnace, and heated at 930° C. for 2 hours in an atmosphere containing 100% oxygen. After having been cooled at a rate of 5° C. an hour, a superconductive ceramic film of this invention, of which the thickness is 5 μm, of which the mean crystal size is 0.8 μm, and of which the porosity is 1.2%, is produced. Test pieces for the determination of superconductivity are prepared from the ceramic film thus produced. The variation of their electric resistance and their current density in the zero magnetic field is determined while temperatures are being varied with a cryostat.

The relation between the electric resistance and the temperature shows a similar trend to that in FIGURE 1. From this result, the critical temperature is obtained. It is shown in Table 3, together with the critical current density.

Example 8

(1) One hundred parts by weight of oxide fine powder, prepared in the same way as in Example 1, and a copper naphthenate hexane solution, prepared by mixing 2.0 parts by weight of copper naphthenate (produced by Wako Pure Chemicals Co., Ltd.) with 85 parts by weight of hexane, are mixed, and a plate is coated with the solution mixture in the same way as in Example 7.

(2) The plate coated in (1) is sintered at 940° C. for 1 hour in an atmosphere containing 80 % of oxygen and 20% of argon, and allowed to cool at a rate of 10° C. an hour. A ceramic film of this invention, of which the thickness is 9 μm, of which the mean crystal size is 1 μm, and of which the porosity is 2.3%, is produced. Its critical temperature and critical current density in the zero magnetic field are determined in the same way as in Example 7. They are given in Table 3.

Example 9

(1) One hundred parts by weight of oxide fine powder, prepared in the same way as Example 7, and a copper oleate hexane solution, prepared by mixing 49.7 parts by weight of copper oleate (produced by Wako Pure Chemicals Co., Ltd.) with 137 parts by weight of hexane, are mixed, and a plate is coated with the mixture in the same way as in Example 7.

(2) The plate coated in (1) is sintered at 940° C. for 1 hour in an atmosphere containing 100% oxygen, and then allowed to cool at a rate of 15° C. an hour. A ceramic film of this invention, of which the thickness is 7 μm, of which the mean crystal size is 0.8 μm, and of which the porosity is 1.4%, is produced. Its critical temperature and critical current density in the zero magnetic field are determined in the same way as in Example 7. They are given in Table 3.

TABLE 3

| | Ex. 7 | Ex. 8 | Ex. 9 |
|---|---|---|---|
| Critical temperature (°K.) | 88 | 89 | 86 |
| Critical current density (A/cm$^2$) | 8300 | 7500 | 8100 |

The surface of the superconductive ceramic films prepared according to this invention in Examples 7 to 9 is observed respectively under an electron microscope; as a result, they prove to be sintered very closely.

As best seen from the above description and the result of the examples, superconductive ceramic wires and films can be manufactured readily according to this invention. Superconductive wires, especially coated ones prove to be sintered very densely with the aid of copper oxide, a sintering auxiliary agent. Since they are also provided with high critical temperature and stable critical current density over a long period of time, they are a practically valuable material in various industrial fields including electronics, power generation, and medical treatment, and very promising in future.

What is claimed is:

1. A sinterable molding composition for the production of a superconductive ceramic molded product consisting essentially of 100 parts by weight of fine crystals of a superconductive oxide composed of a rare earth element, an alkaline earth metal, copper and oxygen, and 0.2–5.0 parts by weight of copper oxide, wherein said fine crystals of a superconductive oxide have a mean particle size of not greater than 5 μm, said molding composition consisting essentially of:
   an oxide fine powder of a superconductive oxide composed of a rare earth element, an alkaline earth metal, copper and oxygen; and
   an organic copper compound in an amount of 0.2–5.0 parts by weight per 100 parts by weight of said oxide fine powder, calculated in terms of CuO;
   wherein said oxide fine powder has a mean particle size not greater than 1 μm.

2. The molding composition according to claim 1, wherein said mean particle size of said oxide fine powder is not greater than 0.3 μm.

3. The molding composition according to claim 1, wherein said organic copper compound is present in an amount of 0.3–3.0 parts by weight per 100 parts by weight of said oxide fine powder, calculated in terms of CuO.

4. The molding composition according to claim 1, wherein said organic copper compound is at least one compound selected from the group consisting of a copper alkoxide, a hydrolyzed product of a copper alkoxide, copper naphthenate, copper oleate, copper gluconate, copper acetate and copper formate.

5. A coated superconductive ceramic sintered product comprising
   a superconductive ceramic sintered product consisting essentially of 100 parts by weight of fine crystals of a superconductive oxide composed of a rare earth element, an alkaline earth metal, copper and oxygen, and 0.2-5.0 parts by weight of copper oxide, wherein said fine crystals of a superconductive oxide have a mean particle size of not greater than 5 μm; and a coating thereon of at least one plastic selected from the group consisting of ethylene-vinyl alcohol copolymer, polyvinylidene chloride, polyacrylonitrile, amorphous nylon, and polyethylene-terephthalate.

6. A coated superconductive ceramic sintered product comprising a superconductive ceramic sintered product consisting essentially of 100 parts by weight of fine crystals of a superconductive oxide composed of a rare earth element, an alkaline earth metal, copper and oxygen, and 0.2-5.0 parts by weight of copper oxide, wherein said fine crystals of a superconductive oxide have a mean particle size of not greater than 5 μm; and a coating thereon which comprises a multilayer coating of metal and plastic and said plastic is at least one plastic selected from the group consisting of polyethylene, polypropylene, polystyrene, polyester, polycarbonate, phenol resin, epoxy resin and polyphenyleneoxide.

7. A process for producing a superconductive ceramic molded product consisting essentially of 100 parts by weight of fine crystals of a superconductive oxide composed of a rare earth element, an alkaline earth metal, copper and oxygen, and 0.2-5.0 parts by weight of copper oxide, wherein said fine crystals of a superconductive oxide have a mean particle size of not greater than 5 μm, said process comprising:

mixing oxide fine powder of a superconductive oxide composed of a rare earth element, an alkaline earth metal, copper and oxygen with a solution of an organic copper compound, said organic copper compound being present in an amount of 0.2-5.0 parts by weight per 100 parts by weight of said oxide fine powder, calculated in terms of CuO, to form a viscous solution mixture, wherein aid oxide fine powder has a mean particle size not greater than 1 μm;

shaping said solution mixture into a molded product by extrusion or by coating it on a plate; and sintering said molded product in an oxygen-containing atmosphere to form said superconductive ceramic molded product.

8. A process for producing a superconductive ceramic molded product consisting essentially of 100 parts by weight of fine crystals of a superconductive oxide composed of a rare earth element, an alkaline earth metal, copper and oxygen, and 0.2-5.0 parts by weight of copper oxide, wherein said fine crystals of a superconductive oxide have a mean particle size of not greater than 5 μm, said process comprising:

mixing 100 parts by weight of an oxide fine powder of a superconductive oxide composed of a rare earth element, an alkaline earth metal, cooper and oxygen, wherein said oxide fine powder has a mean particle size not greater than 1 μm, with a solution of an organic copper compound, said organic copper compound being present in an amount of 0.2-5.0 parts by weight per 100 parts by weight of said oxide fine powder, calculated in terms of CuO, to form a solution mixture, drying said solution mixture to form a powder;

adding a solvent for said organic copper compound to said powder to form a viscous solution mixture;

shaping said viscous solution mixture into a molded product by extrusion or by coating it on a plate; and sintering said molded product in an oxygen-containing atmosphere to form said superconductive ceramic molded product.

9. The process according to claim 7 or 8 wherein said sintering of said molded product is carried out at a temperature of between 750° C. and 980° C.

10. The process according to claim 7 or 8 wherein said sintering of said molded product is carried out at a temperature of between 850° C. and 980° C.

11. The process according to claim 7 or 8 wherein, prior to said mixing of said oxide fine powder with said solution of an organic copper compound, said oxide fine powder is calcined at a temperature of 550° C. or more.

12. The process according to claim 7 or 8, further comprising the step of coating said superconductive ceramic molded product with at least one of a metal or a plastic.

13. The process according to claim 7 or 8, further comprising the step of cooling said superconductive ceramic molded product, after sintering, at a rate of 60° C./hour or less in said oxygen-containing atmosphere.

* * * * *